United States Patent [19]

Welter

[11] 4,362,501
[45] Dec. 7, 1982

[54] PROCESS AND ARRANGEMENT FOR THE ZONAL HEATING OR COOLING OF ELONGATE TREATMENT MEMBERS

[75] Inventor: Jean-Marie Welter, Aachen, Fed. Rep. of Germany

[73] Assignee: Kernforschungsanlage Julich Gesellschaft mit beschrankter Haftung, Julich, Fed. Rep. of Germany

[21] Appl. No.: 230,111

[22] Filed: Jan. 29, 1981

[30] Foreign Application Priority Data

Jan. 31, 1980 [DE] Fed. Rep. of Germany ....... 3003429

[51] Int. Cl.³ .......................... F27B 9/00; F27D 3/00; H05B 3/62
[52] U.S. Cl. ...................................... 432/11; 373/109; 373/113; 373/116; 432/121; 432/148; 432/162
[58] Field of Search ................ 432/11, 121, 141, 143, 432/147, 148, 122, 124, 162; 156/604; 266/276, 277; 13/20, 34, DIG. 1; 373/13

[56] References Cited

U.S. PATENT DOCUMENTS

| 784,856 | 3/1905 | Green | 432/122 |
|---|---|---|---|
| 1,137,711 | 4/1915 | Gottschalk | 432/122 |
| 2,154,673 | 4/1939 | Fleck et al. | 432/11 |
| 2,696,978 | 12/1954 | Siegel | 432/124 |
| 2,952,722 | 9/1960 | Jackson | 13/20 |
| 3,429,974 | 2/1969 | Watson et al. | 13/20 |
| 3,752,897 | 8/1973 | Atsukawa | 13/20 |
| 3,975,618 | 8/1976 | Goos et al. | 432/121 |
| 4,059,398 | 11/1977 | Zimmer et al. | 432/121 |

FOREIGN PATENT DOCUMENTS 435452 2/1934 United Kingdom ................ 432/122

Primary Examiner—John J. Camby
Attorney, Agent, or Firm—Scully, Scott, Murphy & Presser

[57] ABSTRACT

A process and arrangement for the continual zonal heating or cooling of preferably elongate treatment members within at least one zone extending perpendicular or transverse to the longitudinal axis, which programmatically traverses the treatment member in the longitudinal direction.

24 Claims, 4 Drawing Figures

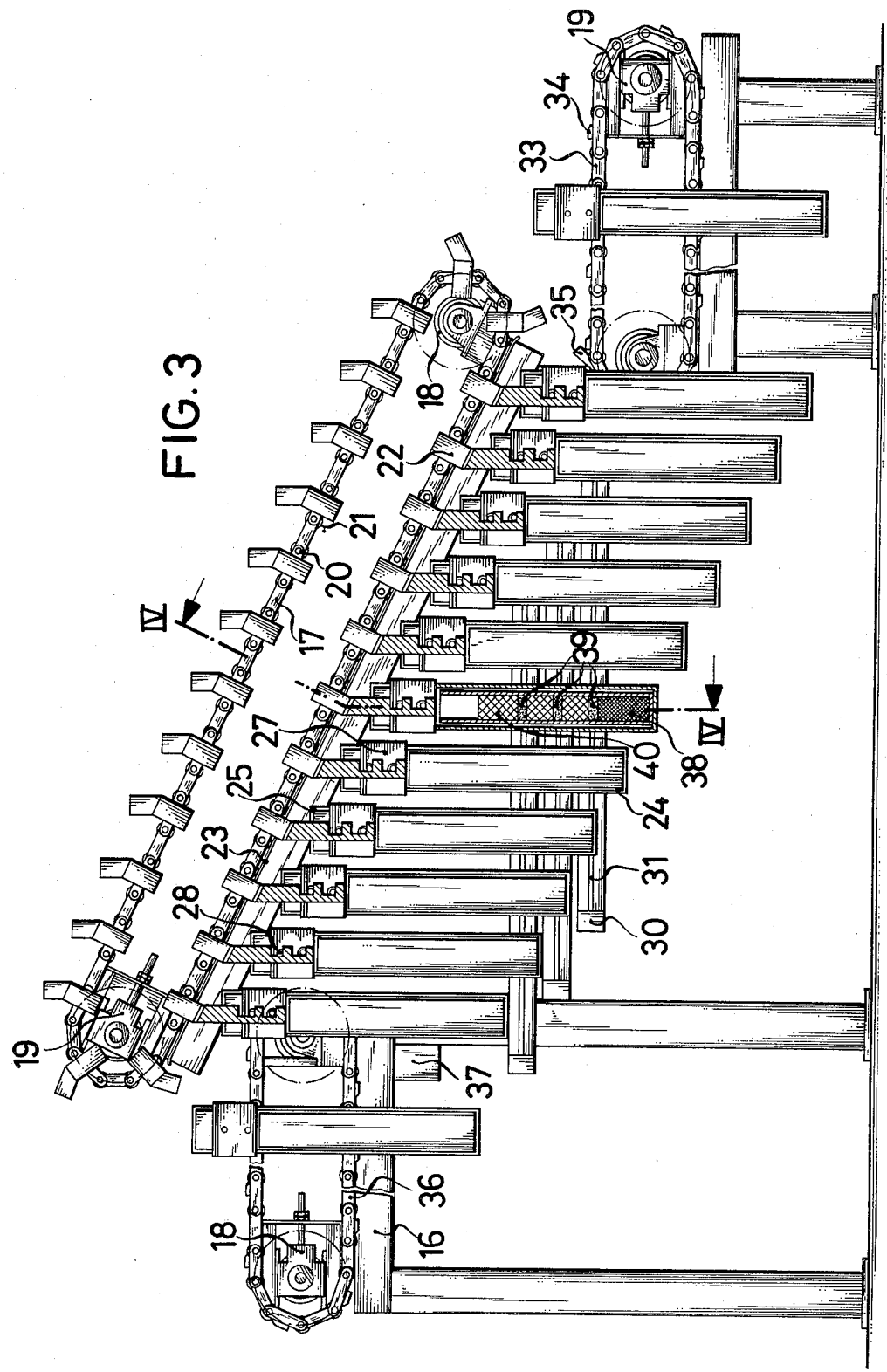

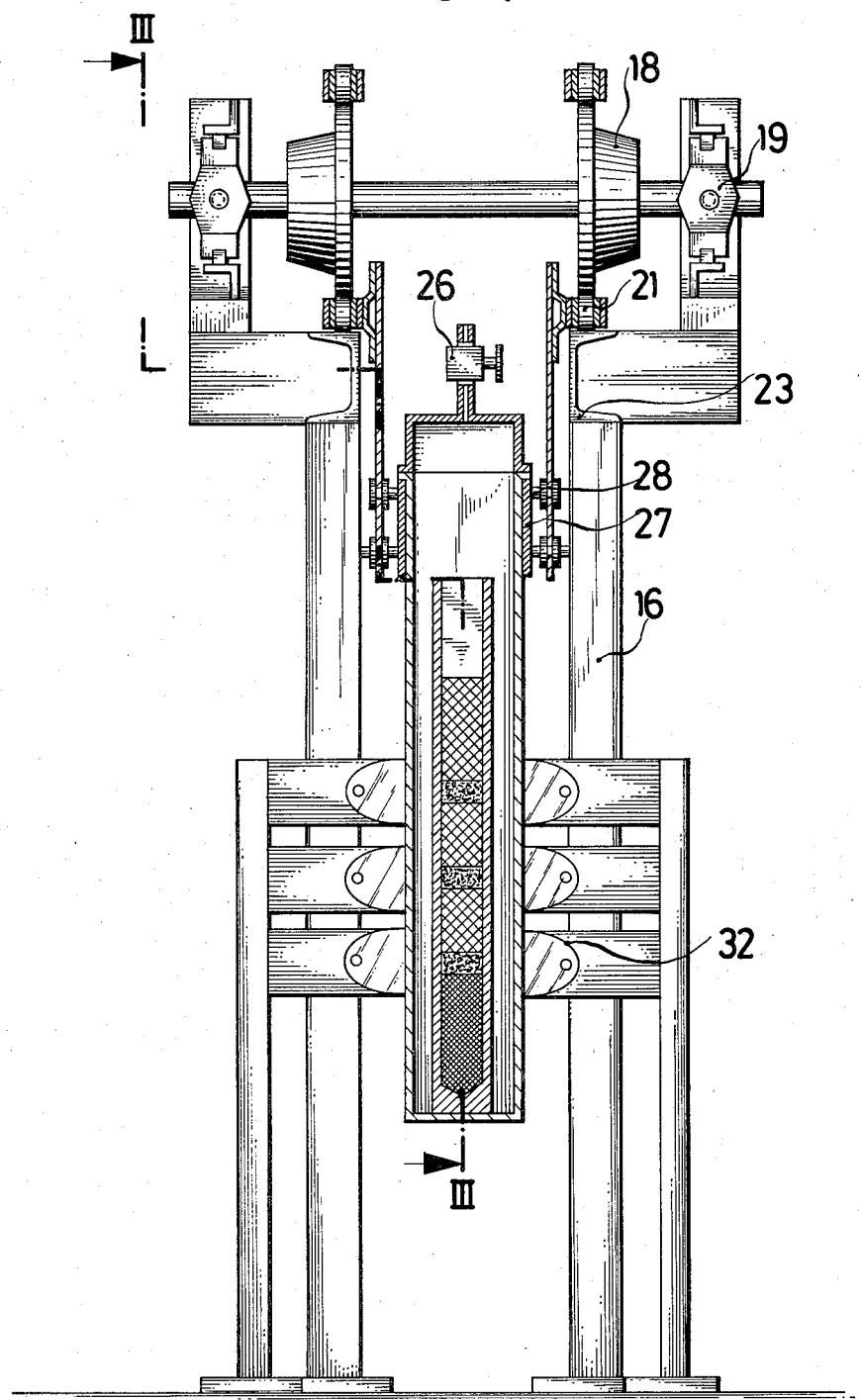

PROCESS AND ARRANGEMENT FOR THE ZONAL HEATING OR COOLING OF ELONGATE TREATMENT MEMBERS

BACKGROUND OF THE INVENTION

1. Field of the Invention

The present invention relates to a process for the continual zonal heating or cooling of preferably elongate treatment members within at least one zone extending perpendicular or transverse to the longitudinal axis, which programmatically traverses the treatment member in the longitudinal direction; as well as relating to an arrangement for the effectuation of the process.

The zonal heating or cooling of elongate members plays an important role in the production < zonal tempering > of directionally solidified molded members such as for example, high performance turbine vanes and permanent magnets, of zonally molten, particularly pure monocrystalline and polycrystalline members which are constituted, for instance, of silicon, as well as heat-treated products by < >.

2. Discussion of the Prior Art

The directional solidification as well as the zonal smelting are techniques which have been utilized for a long time. Herein the usually elongate treatment members and the heating or cooling zones which are located perpendicular relative the longitudinal axis thereof are moved relative to each other.

The know arrangements for the effectuation of these processes are operated in a chargewise mode with individual members. Hereby there must be frequently assumed considerable re-equipping periods for the introduction of new treatment members. Due to the small throughput a large number of individual installations are required in order to produce larger quantities of material.

SUMMARY OF THE INVENTION

Accordingly, it is an object of the present invention to provide a process which affords a more economical manufacture of larger quantities of directionally solidified, zonally purified or heat-treated products.

The inventive process of the above-mentioned type which has been developed for attainment of this object is characterized in that a plurality of treatment members which are mutually arranged in perpendicular or transverse axially parallel relative to their longitudinal axis are subjected to a translational movement through an elongate, occasionally curved heating or cooling zone, resulting from a movement in the longitudinal direction of the heating or cooling zones and from a movement along the axis parallels of the treatment members.

Through these axially parallel, but not only along the axis effected movement of the treatment members through an elongate heating or cooling zone, it becomes possible to concurrently allow a series of mutually parallel arranged members to travel through the heating zone whereby there is rendered possible a continuous mode of operation in mass produced series, and not only in individual products.

The process has been developed in particular so as to permit molded members to be directionally solidified from the smelt, or to subject already produced members to a zonal smelting process. The heating zone should then be selected to preferably extend exactly horizontally in order to avoid the action of additional gravitational effects on the smelt materials.

BRIEF DESCRIPTION OF THE DRAWINGS

Practical embodiments of arrangements for the effectuation of the inventive process are described in detail hereinbelow, taken in conjunction with the accompanying drawings; wherein in a generally diagrammatic representation:

FIGS. 3 and 4 illustrate a further arrangement for the effectuation of a zonal smelting process.

DETAILED DESCRIPTION

Figure 1:
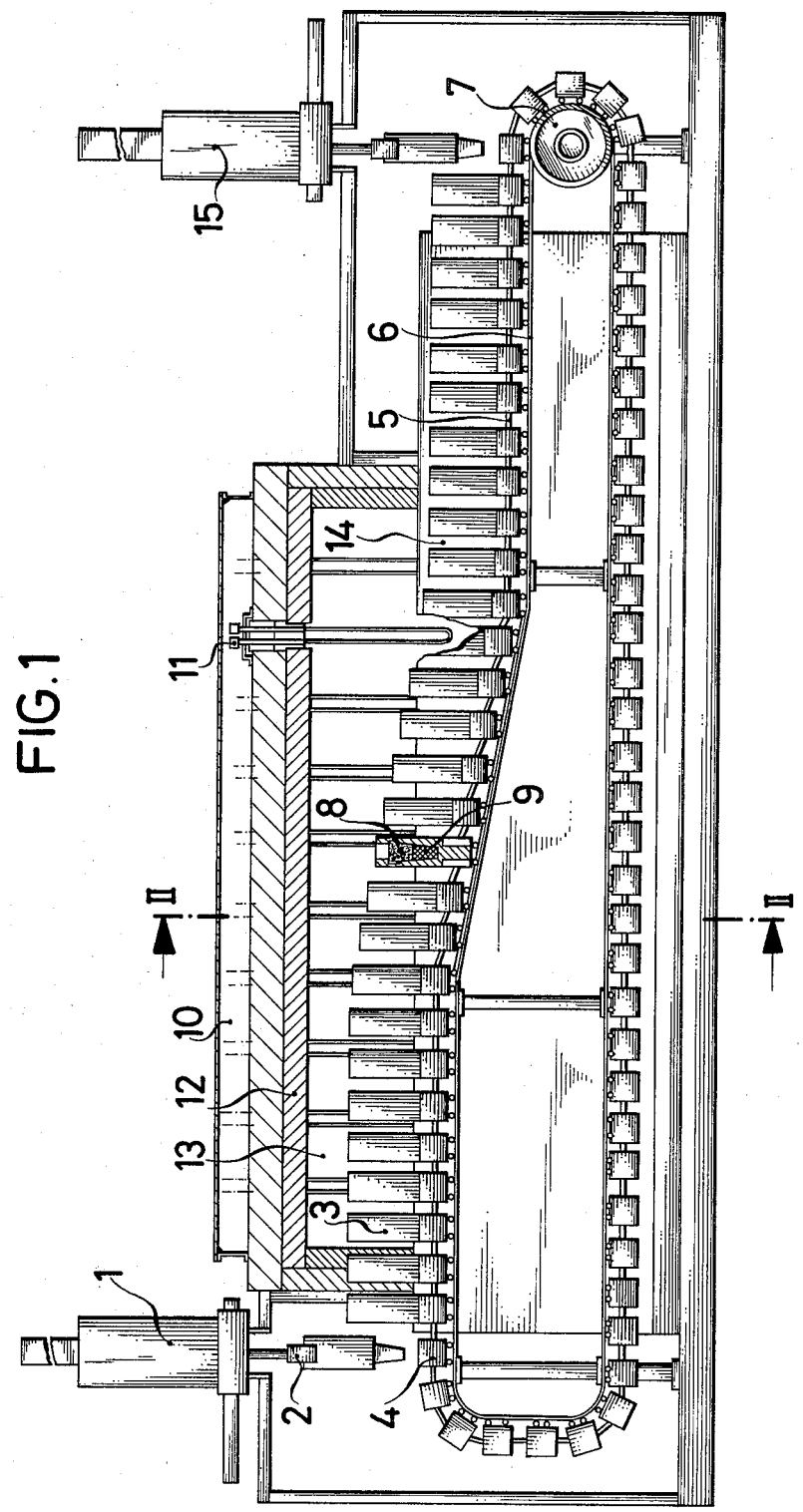
FIGS. 1 and 2 illustrate, respectively in side elevation and transverse section, an arrangement which is particularly adapted for the production of directionally solidified members.
Figure 2:
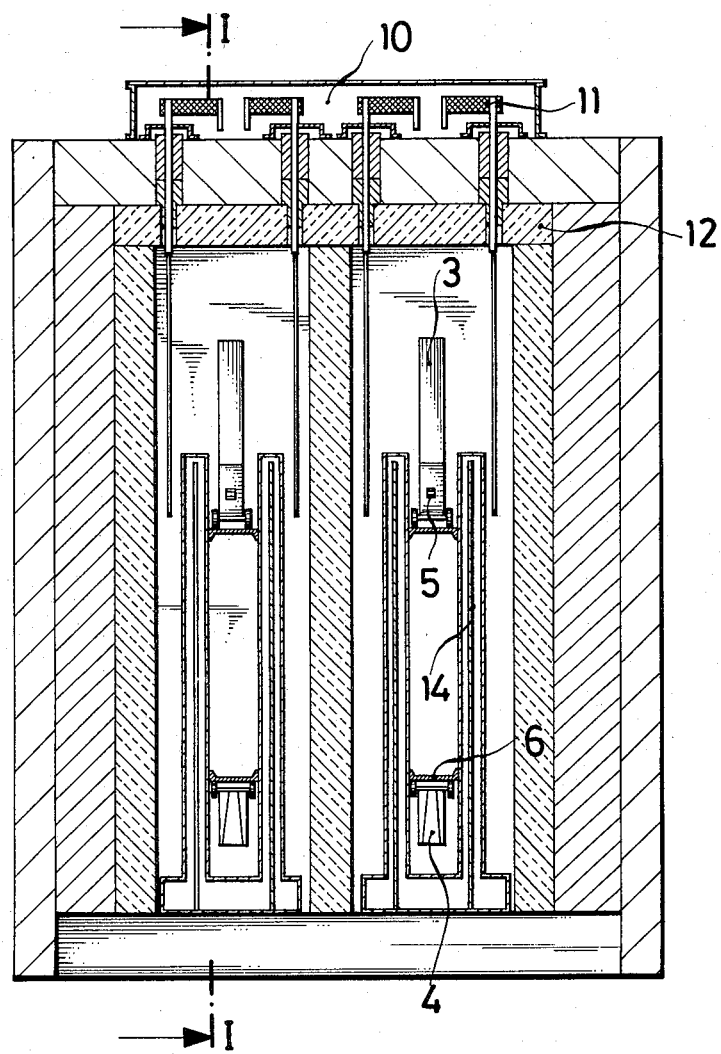

The installation which is schematically illustrated in FIGS. 1 and 2 is designed as a tandem oven in order to save different auxiliary aggregates and heat losses through the sides;

a vacuum oven in order to avoid the contamination of the smelt through the air components and to prevent heat losses through convection. A pressure reduction in the region of 0.1 mbar is adequate and is afforded by means of roll piston pumps.

The installation is divided into five regions A through E. The actual continuous-heating oven consists of the three regions B, C and D.

In the exemplary embodiment, the upper portion 13 of the oven chamber is electrically heated. For this purpose high-temperature resistor elements 11 are conducted through the oven ceiling 12 and electrically interconnected in a switch box 10. The oven wall consists of high-temperature resistant ceramic tiles. The lower region is shielded with a pair of water-cooled radiation shields 14 against the effect of the heat. Through the pulling up of these cooling shields into the upper part of the oven chamber there is produced a colder stack with a rapid transition of high/low temperatures. This provides an extremely effective vertical temperature gradient such as, for example, would be required during the production of eutectic crystals. Hereby, the upper part of the oven chamber need only be maintained at a constant temperature.

In the inserting section A, the crucible 3 together with the filling material is transferred with a gripping system 2 from an external stacking belt through the air lock 1 into the installation and inserted into the crucible holder 4. The crucible holders run on the guide rails 6 and, with the aid of the chain elements 5, form an endless conveyor web. The guide wheels 7 moves the web forwardly with a preselectable speed. The station time of the transfer system is obtained from the spacing between the crucible holders and from the speed of conveyance.

In the smelting section B, the crucible moves above the cold stack and is heated. The crucible filling is molten and brought to the desired final temperature. This is achieved in that this oven region is equipped with a horizontal temperature gradient.

In the solidification section C, the crucible is moved down into the cold stack through an inclined movement of the conveyor web so that the smelt 8 will gradually solidify into crystal 9. The guide system for the web is so designed as to maintain the crucible holders, and to that extent the solid/liquid phase interface, always horizontal. The speed of solidification is determined through the angle of inclination or slope of the guide rails and by the speed of conveyance. Through a localized change in the angle of inclination the speed of solidification can be influenced. This is of advantage for complicated molded members in which different areas must be hardened at different rapidies.

In the cooling section D, the crucible is located entirely within the cold stack and the crystal cools down slowly so as to prevent the occurrence of mechanical stresses.

In the outlet section E, there takes place the same sequence of operative steps as in the inserting section, however, in a reverse sequence so as to transfer the crucible through the outlet lock 15 to a stacking belt.

Auxiliary installations such as external stacking belts, drive motors, vacuum aggregates, measuring devices for temperature and vacuum are not illustrated.

The drawn installation is dimensional as follows:

| | |
|---|---|
| Length of the entire installation | 1080 cm |
| Length of the heated section | 550 cm |
| Volume of the heat section (per stack) | $0.6 \times 10^6$ cm$^3$ |
| Oven temperature | about 1500° C. |
| Required heating power (per stack) | about 70 kW |
| Number of heating elements (per stack) | about 20 pieces |
| Length of the solidification section | 300 cm |
| Inclination of the conveyor web | 10% |
| Conveying speed | 50 cm per hour |
| Solidification speed | 5 cm per hour |
| Crucible dimensions (H × B × D) | $50 \times 20 \times 10$ cm$^3$ |
| Height of the smelt | about 30 cm |

The installation can operate fully automatically. During a 24-hour operation there are produced approximately 50 molded members per stack, thus a total of about 100 members for the installation.

The installation for zonal smelting of elongate treatment members drawn in FIGS. 3 and 4 possesses the following constructive and processing technological features:

A main element is the endless rotating web 17 which is inclined relative to the horizontal, on the chain elements 20 of which there are fastened the suspension hooks 22 for the crucible holders 24. In order to achieve a uniform run, at least one guide wheel 18 is engaged with the arrangement 19. Furthermore, the chain rollers 21 run on the guide rail 23.

The crucible holder 24, in this embodiment, consists of a quartz-glass tube which is closed at one end. After the filling of the crucible 29 with the material 38 which is to be purified, it is built into the holder. The latter is hermetically closed with the cover 25 and evacuated through the valve 26, and eventually filled with a suitable gas mixture. For the further machine manipulation of the crucible holder there is provided a sleeve 27 which includes to cam pairs 28.

After the preparation of a series of crucible holders, these are mounted in a stand-by position on the conveyor web 33, transported by means of the sliders 34 to the oven portion and snapped into the suspension hooks 22 by the pivot arm 35. Since it is assumed here that the density of the smelt of the material which is to be purified is higher than that of the solid member, the crucible so introduced into the oven portion that initially the upper free portion 40 of the material will smelt and again solidify.

In this installation three smelts zones 39 are smelted with the linear radiators 30. The radiation which is emitted by the tungsten filaments 31 are focused by means of the ellipsoid mirrors 32 on the crucible wall. Pursuant to the angle of inclination of the conveyor web and the distance of the filaments are the radiators mounted offset. Since the heat is radiated into the crucible only from two opposite sides, it is satisfactory to have a large ratio of width to depth so as to afford a uniform heating. In order to maintain the radiation losses as small as possible, it is also advantageous to have the crucibles follow as closely as possible. After passing through the oven zone, the pneumatic piston 37 unlatches the crucible holders and lifts them up onto the conveyor web 36. Here they cool and remain stored until further treatment.

The three conveyor webs 17, 33 and 36 and the three radiator pairs 30 are mounted in the frame 16. The drive aggregates of the webs and the synchronizing control for the latching in and out elements are not illustrated.

The angle of inclination of the central conveyor web of the illustrated installation is 25°. At a typical recyrstallization speed of 1 mm per minute, the crucible holder requires approximately 600 minutes in order to traverse the oven zone. At a crucible spacing of 137.5 mm a crucible holder leaves the oven region approximately every 64 minutes. In the known discontinuous process, at the same recrystallization speed, a crucible remains for at least 800 minutes in the installation. Through the novel installation there is achieved a thirteen-time increase in capacity.

Variations of the described installation may be mentioned for example, as follows:

Reversal in the smelt direction when the smelt possesses a higher density than the solid member;

Smelting with high-frequency energy with the utilization of an elongate induction coil;

Horizontal suspension of the crucible holder between two inclined traveling conveyor webs so as, with a vertical oven arrangement, move the smelt zones horizontally in an open mooring crucible.

What is claimed is:

1. An apparatus for the continual heat treatment of a filling contained within a crucible, said apparatus comprising:
   a. an oven having a ceiling with heating means transversely extending therethrough so as to locally heat a portion of said oven;
   b. said portion comprising substantially the upper portion of said oven whereby a horizontally extending heating zone is formed;
   c. at least one endless conveyor disposed within said oven, said conveyor having at least one portion thereof inclined relative to the horizontal axis of the upper portion of said oven; said conveyor having crucible holders equally spaced along said conveyor and attached thereto; said conveyor being moved by a driving means;
   d. means for placing crucibles in said crucible holders;
   e. means for preventing heat in said upper portion from extending throughout said oven; said means for preventing having a portion of said conveyor disposed therein;
   f. means for removing said crucibles from said crucible holders and said oven.

2. An apparatus as defined in claim 1, said conveyor further having a means for retaining said crucibles in a substantially vertical relationship to the horizontal axis of said oven, said means comprising a guide system having guide rails disposed on either side of said conveyor and chain elements interlinking said crucible holders.

3. An apparatus as defined in claim 1, said heating means comprising high-temperature resistor elements which extend downwardly into the upper portion of said oven.

4. An apparatus as defined in claim 1, said means for placing said crucibles comprising a gripping system which transfers a crucible from an external stacking belt through an air lock and into a crucible holder.

5. An apparatus as defined in claim 1, said means for preventing heat from extending throughout the oven comprising a pair of water-cooled radiation shields disposed about the conveyor and below the upper portion of the oven, said shields prevent the heat in the upper portion from extending below said shields whereby a vertical temperature gradient is established throughout the oven.

6. An apparatus as defined in claim 5, said shields disposed so as to completely circumscribe said conveyor and said crucibles disposed thereon so as to insulate said crucibles from the heat in said upper portion of said oven.

7. An apparatus as defined in claim 5, said shields being vertically adjustable so as to alter the vertical gradient of temperature within the oven.

8. An apparatus as defined in claim 1, said means for removing said crucibles comprising a gripping system which transfers a crucible from a crucible holder through an air-lock to an external stacking belt.

9. An apparatus as defined in claim 1, said endless conveyor comprising a transport web.

10. An apparatus for the manufacture of unidirectionally solidified articles by a continual zonewise heat treatment of a material contained within a crucible, said apparatus comprising:
 a. an oven having heating means positioned therein which produce a vertical temperature distribution which encompasses the melting point of said material in said oven, said heating means being arranged so as to induce horizontally extending zones of equal temperature;
 b. at least one endless conveyor transferring a series of said crucibles through said oven along an inclined path relative to said horizontal heating zones, whereby said material within said crucible is subjected to varying temperatures, said conveyor further having crucible holders which receive said crucibles and is moved by a driving means;
 c. means for placing said crucibles in said holders and means for removing said crucibles from said holders.

11. An apparatus for the continual heat treatment of a filling contained within a crucible, said apparatus comprising:
 a. an oven having a heating means disposed therein, said heating means extending parallel to the horizontal axis of said oven whereby a horizontal heating zone is formed;
 b. at least one endless conveyor disposed within said oven, said conveyor having at least a portion thereof inclined relative to the horizontal axis of said heating means, said conveyor having crucible holders affixed thereto and is positioned substantially above said heating means, said conveyor further having a driving means;
 c. means for placing crucibles in said crucible holders;
 d. means for removing said crucibles from said conveyor disposed above said heating means.

12. An apparatus as defined in claim 11, said heating means comprising at least one linear radiator having tungsten filaments contained therein and ellipsoid mirrors whereby the radiation therefrom is concentrated onto the crucibles.

13. An apparatus as defined in claim 11, said conveyor positioned above said heating means comprising two conveyors arranged on either side of said heating means and includes support elements for the latching of the crucibles at both ends thereof whereby said crucibles are maintained in relative substantially parallel relationship.

14. An apparatus as defined in claim 11 or 13, said conveyor comprising a transport web supported by rollers running on rails.

15. An apparatus as defined in claim 11, said means for placing crucibles in said crucible holders comprising an endless conveyor belt for supporting said crucibles; hooks extending from said upwardly positioned conveyor; and a cover on said crucibles having a means for attaching said cover to said hooks.

16. An apparatus as defined in claim 11, said means for removing said crucibles comprising a pneumatic piston.

17. An apparatus as defined in claim 11 or 13 or 15, said conveyor comprising a transport web.

18. A process for the continual heat treatment of crucibles having a filling disposed therein within an oven, said oven having a heating means disposed therein which creates a horizontal heating zone in said oven; at least one endless transport web having crucible holders attached thereto, said crucibles being positioned within said holders; said conveyor having at least one portion thereof inclined relative to the horizontal axis of the oven, said process comprising:
 a. placing said crucibles onto said transport web; and driving said transport web so as to move said crucibles;
 b. passing said crucibles through said heating zone wherein the filling within the crucible is melted;
 c. moving said crucibles along the inclined portion of said transport web and maintaining said crucible in substantial vertical relationship relative to the horizontal axis of said heating zone;
 d. subsequently moving said crucibles into a cooling zone wherein said filling can cool to a desired temperature;
 e. removing said cooled crucibles from said oven.

19. A process as defined in claim 18, comprising varying the heating or cooling speed through changing the angle of inclination of the transport web relative to the horizontal heating zone.

20. A process as defined in claim 18, comprising varying the heating or cooling speed through changing the speed of the conveyor.

21. A process as defined in claim 18, said cooling zone comprising moving said crucibles into an area of the oven shielded from the heating means wherein cooling can take place.

22. A process as defined in claim 18, said cooling zone comprising moving said crucibles to another conveyor disposed above and remote from said heating means.

23. A process as defined in claim 18, comprising producing a vertical temperature gradient along the transport web by shielding a portion thereof from the heating means.

24. A process as defined in claim 18 or 22, comprising locating said transport web above said heating means and suspending said crucibles therefrom.

* * * * *